(12) United States Patent
Hsieh et al.

(10) Patent No.: US 12,107,178 B2
(45) Date of Patent: Oct. 1, 2024

(54) METHOD OF FABRICATING A SENSOR DEVICE

(71) Applicant: HIMAX TECHNOLOGIES LIMITED, Tainan (TW)

(72) Inventors: Yu-Jui Hsieh, Tainan (TW); Po-Nan Chen, Tainan (TW); Ya-Jing Yang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 433 days.

(21) Appl. No.: 17/565,396

(22) Filed: Dec. 29, 2021

(65) Prior Publication Data
US 2022/0123160 A1   Apr. 21, 2022

Related U.S. Application Data

(62) Division of application No. 16/880,950, filed on May 21, 2020, now Pat. No. 11,476,374.

(51) Int. Cl.
*H01L 31/0236* (2006.01)
*H01L 31/0216* (2014.01)
*H01L 31/101* (2006.01)
*H01L 31/18* (2006.01)

(52) U.S. Cl.
CPC .. *H01L 31/02366* (2013.01); *H01L 31/02162* (2013.01); *H01L 31/1016* (2013.01); *H01L 31/186* (2013.01)

(58) Field of Classification Search
CPC ......... H01L 31/02366; H01L 31/02162; H01L 31/1016; H01L 31/186; H01L 31/02; H01L 31/02327; H01L 2223/5442; H01L 2223/54426; H01L 2223/54453; H01L 23/544; G03F 9/7076; G03F 9/708; G03F 9/7084
See application file for complete search history.

(56) References Cited

U.S. PATENT DOCUMENTS

| | | | |
|---|---|---|---|
| 2003/0106987 A1* | 6/2003 | Komaba | H01L 27/14636 250/214.1 |
| 2019/0129530 A1* | 5/2019 | Shen | H04N 23/51 |
| 2020/0266305 A1* | 8/2020 | Lee | H01L 31/02164 |
| 2021/0098260 A1* | 4/2021 | Yoon | H01L 21/3081 |

\* cited by examiner

*Primary Examiner* — Sitaramarao S Yechuri
(74) *Attorney, Agent, or Firm* — JCIPRNET

(57) ABSTRACT

A sensor device provided in the disclosure includes a sensor substrate, a first transparent layer, a collimator layer, and a lens. The first transparent layer is disposed on the sensor substrate, wherein the first transparent layer defines an alignment structure. The collimator layer is disposed on the first transparent layer. The lens is disposed on the collimator layer.

7 Claims, 6 Drawing Sheets

METHOD OF FABRICATING A SENSOR DEVICE

CROSS-REFERENCE TO RELATED APPLICATION

This application is a divisional application of and claims the priority benefit of U.S. application Ser. No. 16/880,950, filed on May 21, 2020, now pending. The entirety of the above-mentioned patent application is hereby incorporated by reference herein and made a part of this specification.

BACKGROUND

Technical Field

The disclosure is related to an electronic device and method of fabricating the same, and particularly to a sensor device and method of fabricating the same.

Description of Related Art

Upon the spreading of the application of electronic devices, a sensor device, for example an optical sensor device serving a fingerprinting identifying function becomes more and more emphasized. In a sensor device, one or more film layer may absorb light or certain radiation for providing required optical effect, which renders the alignment process in the method of fabricating a sensor device difficult since the alignment process is usually relied on visual-determination.

SUMMARY

The disclosure is directed to a sensor device having a rugged alignment structure for alignment process.

The disclosure is directed to a method of fabricating a sensor device with improved alignment.

In accordance with some embodiments, a sensor device includes a sensor substrate, a first transparent layer, a collimator layer, and a lens. The first transparent layer is disposed on the sensor substrate, wherein the first transparent layer defines an alignment structure. The collimator layer is disposed on the first transparent layer. The lens is disposed on the collimator layer.

In accordance with some embodiments, the alignment structure includes an alignment opening.

In accordance with some embodiments, the alignment structure further includes an alignment bump positioned within the alignment opening.

In accordance with some embodiments, the first transparent layer includes a padding portion, and the collimator layer is disposed on the padding portion.

In accordance with some embodiments, the alignment structure is beside the padding portion.

In accordance with some embodiments, a second transparent layer is further disposed between the collimator layer and the lens.

In accordance with some embodiments, the sensor substrate includes an internal alignment mark covered by the first transparent layer.

In accordance with some embodiments, the alignment structure is a rugged structure on the sensor substrate.

In accordance with some embodiments, a method of fabricating a sensor device includes the following steps. A transparent material layer is formed on a sensor substrate. The transparent material is patterned into a first transparent layer, wherein the first transparent layer defines an alignment structure. A material layer is coated on the sensor substrate, wherein a portion of the material layer covering the alignment structure is staggered along with the alignment structure. The material layer is patterned using the staggered portion as an alignment mark.

In accordance with some embodiments, the sensor substrate includes an internal alignment mark and the first transparent layer is formed by using the internal alignment mark for alignment.

In accordance with some embodiments, the material layer visually shields the internal alignment mark.

In accordance with some embodiments, the material layer is patterned to form a collimator layer.

In accordance with some embodiments, the transparent material layer is patterned to define an alignment opening to form the alignment structure.

In accordance with some embodiments, the transparent material layer is patterned to define an alignment bump positioned within the alignment opening to form the alignment structure.

In accordance with some embodiments, the staggered portion of the material layer is staggered along with the alignment bump.

In accordance with some embodiments, the staggered portion of the material layer is removed by patterning the material layer.

In accordance with some embodiments, the transparent material is patterned to form a padding portion, and a portion of the material layer above the padding portion is remained after patterning the material layer.

In accordance with some embodiments, a lens is further formed on the portion of the material layer.

In view of the above, the sensor device in accordance with some embodiments of the disclosure includes an alignment structure forming a rugged surface on the sensor substrate. The alignment structure causes the overlying material layer to have an intrinsic alignment structure for alignment during the patterning process. Therefore, the method of fabricating the sensor device may have an improved yield rate and the sensor device may have a desirable yield.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
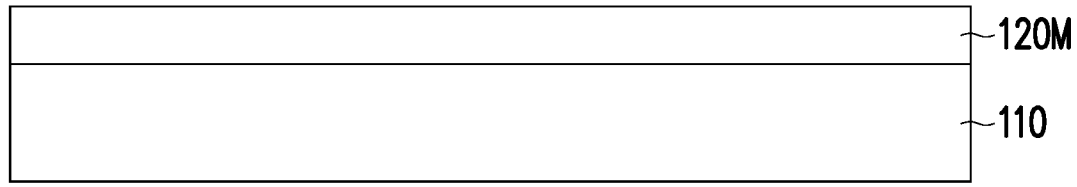
FIG. 1 to FIG. 8 schematically illustrate a method of fabricating a sensor device in accordance with some embodiments of the disclosure.

FIG. 1 to FIG. 8 schematically illustrate a method of fabricating a sensor device in accordance with some embodiments of the disclosure. In FIG. 1, a sensor substrate 110 is provided. In some embodiments, the sensor substrate 110 may be a semiconductor substrate including sensor elements formed therein. The sensor element formed in the sensor substrate 110 may include a complementary metal oxide semiconductor (CMOS), a charge coupled device (CCD) sensor element, or the like. A transparent material layer 120M is formed on the sensor substrate 110. The transparent material layer 120M is formed by a coating process and the transparent material layer 120M may cover the entire top surface of the sensor substrate 110, but is not limited thereto. In some embodiments, the material of the transparent material layer 120M may include photo-sensitive material such as a photoresist material. For example, the material of the transparent material layer 120M may be a negative-type photoresist material, bur the disclosure is not limited thereto.

Figure 2:
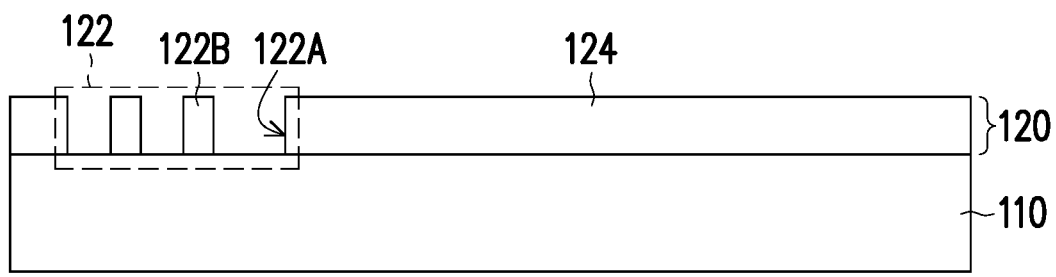

In FIG. 2, the transparent material layer 120M may be patterned to form the first transparent layer 120. The transparent material layer 120M may be patterned by performing a photolithography process. In the photolithography process, a partial exposure step and a developing step are performed. In the case that the material of the transparent material layer 120M is a negative photoresist material, the portion of the transparent material layer 120M subjecting the irradiation of the radiation utilized in the partial exposure step may be photo-reacted to become more insoluble to a developing agent utilized in the developing step and thus is remained on the sensor substrate 110 to construct the first transparent layer 120. In some embodiments, the first transparent layer 120 may define an alignment structure 122 and a padding portion 124. The alignment structure 122 may be positioned beside the padding portion 124. The padding portion 124 may have a substantially even thickness and may be positioned over the sensor element formed in the sensor substrate 110, but the disclosure is not limited thereto.

The alignment structure 122 defined by the first transparent layer 120 may include an alignment opening 122A and an alignment bump 122B positioned within the alignment opening 122A. In some embodiments, the alignment bump 122B may be omitted so that the alignment structure 122 may refer to the alignment opening 122A. The alignment opening 122A is formed by removing the material of the transparent material layer 120M at a predetermined region and thus, the alignment opening 122A forms a low-lying structure on the sensor substrate 110. The alignment bump 122B may be formed by remaining the material of the transparent material layer 120M at a predetermined region and thus, the alignment opening 122A forms a protrusion structure within the alignment opening 122A. Accordingly, the alignment structure 122 is a rugged structure on the sensor substrate 110. In some embodiments, the relief of the alignment structure 112 may be determined by the thickness of the first transparent layer 120. For example, the thicker the first transparent layer 120 the rougher the alignment structure 112.

Figure 3:
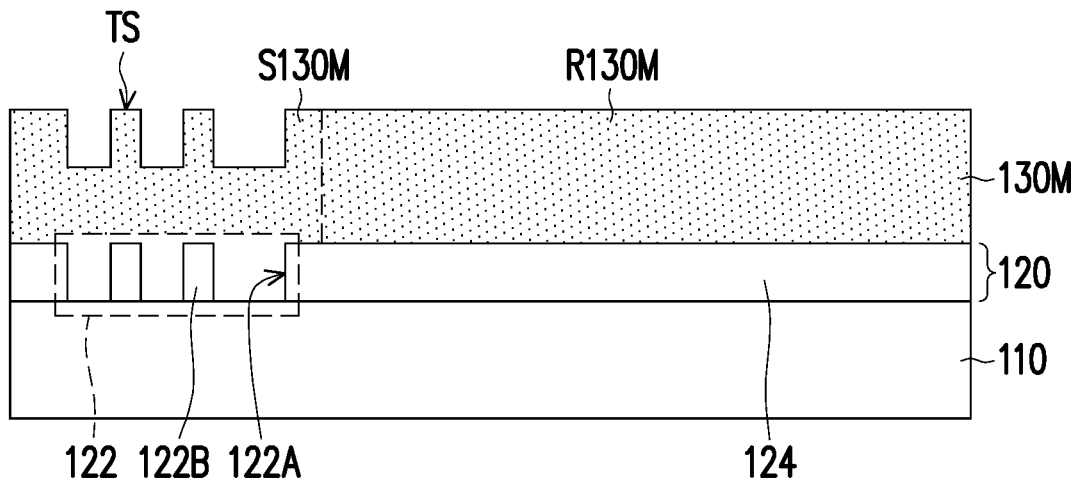

In FIG. 3, a material layer 130M is formed on the sensor substrate 110. The material layer 130M may be formed by a coating process, but in alternative embodiments, the material layer 130M may be formed by a deposition process. The material layer 130M covers the first transparent layer 120 and may be staggered along with the relief caused by the first transparent layer 120. For example, the alignment opening 122A causes a low-lying structure and the alignment bump 122B is a protruding structure so that a portion of the material layer 130M covering the alignment opening 122A may be caved in relative to a portion of the material layer 130M covering the alignment bump 122B. Therefore, the top surface T130M is an uneven surface and is staggered over the alignment structure 122. In the embodiment, the material layer 130M may include a staggered portion S130M covering the alignment structure 122 and a portion R130M covering the padding portion 124.

Subsequently, the material layer 130M may be patterned. In some embodiments, the material layer 130M may be made of a material capable of absorbing or prohibit radiation such as visible light. Therefore, the structure and film layers underlying the material layer 130 are invisible in the step of patterning the material layer 130M. In the embodiment, the top surface TS of the staggered portion S130M in the material layer 130 is staggered along with the underlying alignment structure 122 and is able to be identified by a vision determination. Accordingly, the pattern formed by the staggered portion S130M over the alignment structure 122 may be used as an alignment mark for patterning the material layer.

Figure 4:
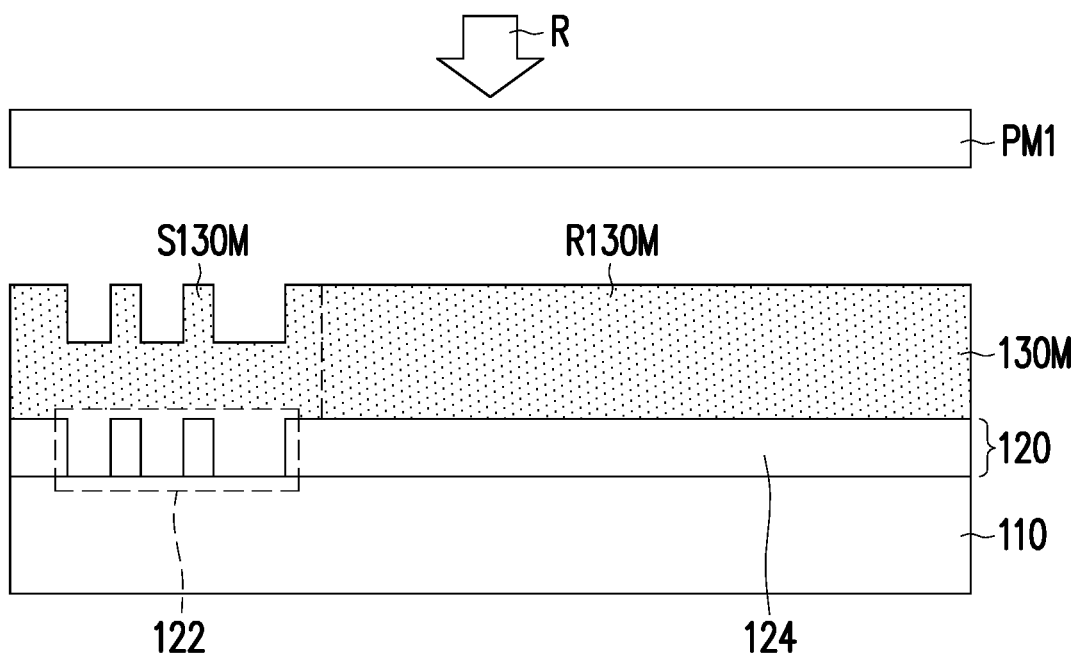

In some embodiments, the material layer 130M may be photo-sensitive and a method of patterning the material layer 130M may include a photolithography process, wherein the photolithography process may include a partial exposure step followed by a developing step. Referring to FIG. 4, in the partial exposure step, a photomask PM1 may be provided and a radiation R may irradiate the sensor substrate 110 with the first transparent layer 120 and the material layer 130M thereon. The photomask PM1 may have required mask pattern thereon and the partial exposure step may be used for transferring the mask pattern of the photomask PM1 onto the material layer 130M, or transferring a complementary pattern of the mask pattern of the photomask PM1 on to the material layer 130M. In the embodiment, the material layer 130M visually shields the underlying layers and structures and thus any alignment mark formed in the underlying layers and structures is invisible during the patterning process. In the present embodiment, the staggered portion S130M of the material layer 130M above the alignment structure 122 may serve as an intrinsic alignment mark in the partial exposure step. Specifically, the photomask PM1 may be aligned with respect to the sensor substrate 110 by using the staggered portion S130M of the material layer 130M above the alignment structure 122 as an alignment reference.

Figure 5:
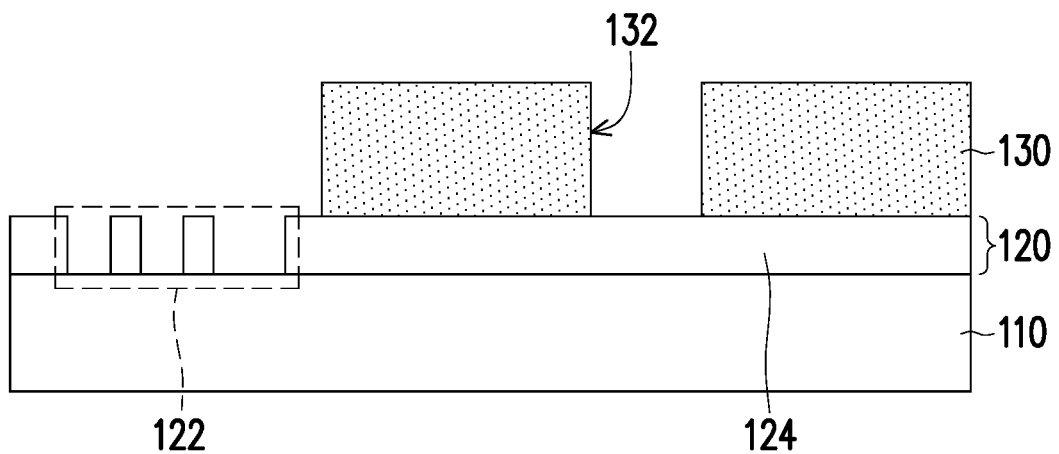

After the partial exposure step, a developing step is performed to remove unwanted portion of the material layer 130M, such as the staggered portion S130M, and remain the required portion of the material layer 130M, such as the portion R130M, on the sensor substrate 110. Specifically, the portion R130M of the material layer 130M above the padding portion 124 of the first transparent layer 120 may be remained while the other portions of the material layer 130M are removed. As shown in FIG. 5, a collimator layer 130 may be formed by patterning the material layer 130M via the step described in FIG. 4. The collimator layer 130 is disposed on the sensor substrate 110 above the padding portion 124 of the first transparent layer 120. In some embodiments, the sensor substrate 110 may include a sensor element and the padding portion 124 and the collimator layer 130 may be disposed over the sensor element to provide required optical-effect for the sensor element. For example, the collimator layer 130 may have an aperture 132 allowing a radiation to be sensed by the senor element in the sensor substrate 110 to pass it through.

Figure 6:
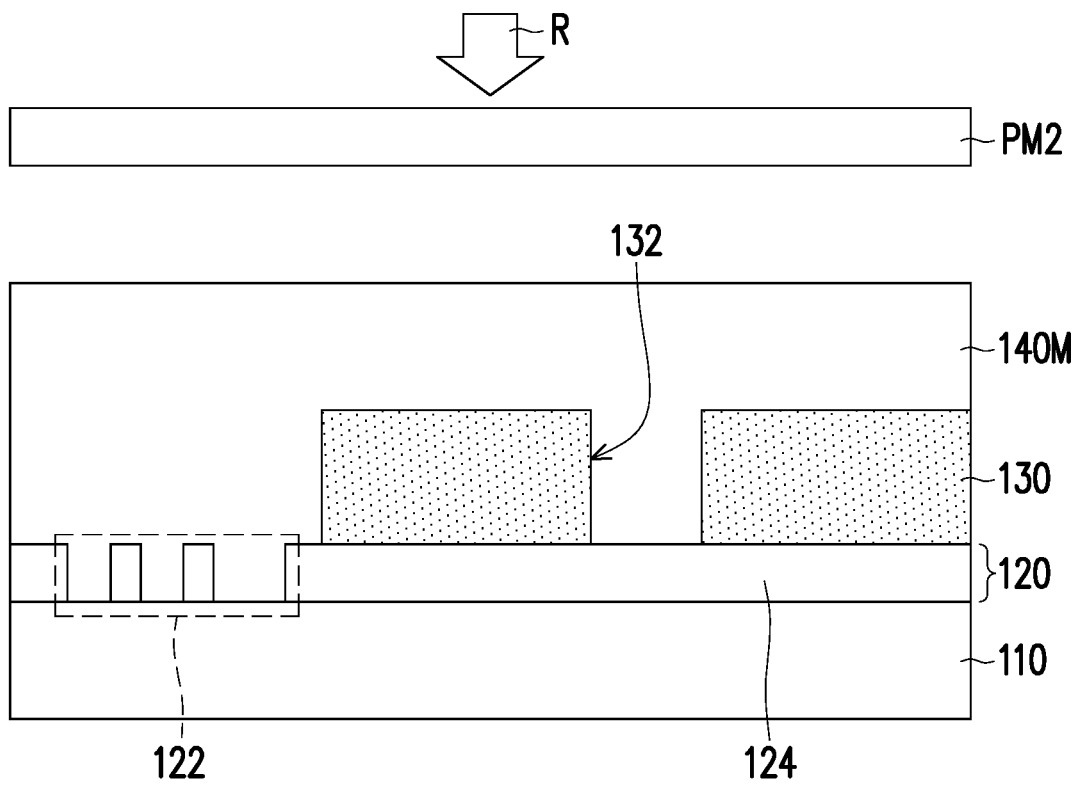
Figure 7:
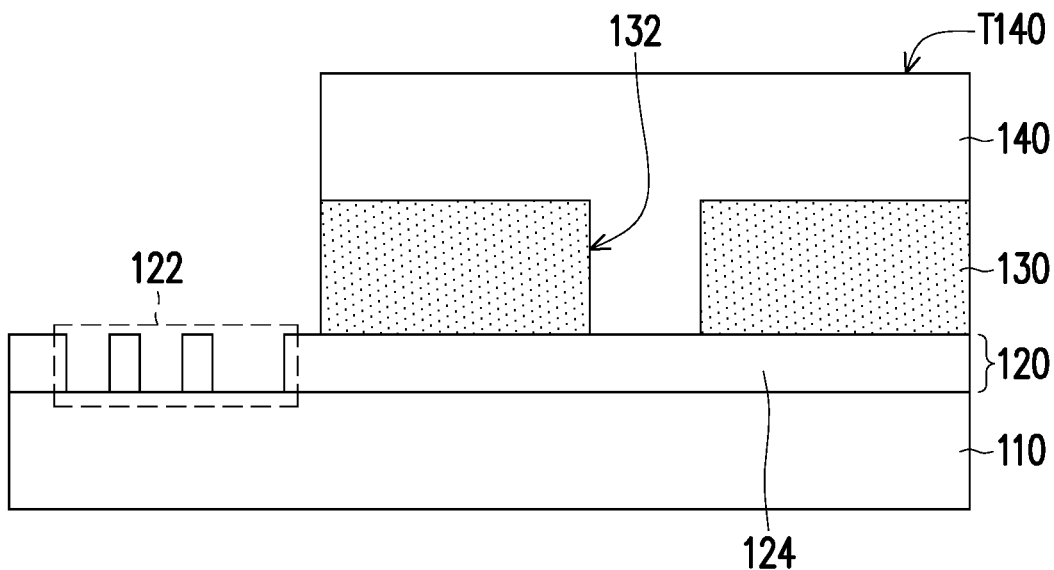

In FIG. 6, another transparent material layer 140M is formed on the sensor substrate 110 with the first transparent layer 120 and the collimator layer 130 thereon. In some embodiments, the transparent material layer 140M is photosensitive and is able to be patterned by a photolithography process. For example, a radiation R may irradiate the sensor substrate 110 through a photomask PM2 in a partial exposure step of the photolithography process. The transparent material layer 140M though covers the alignment structure 122 of the first transparent layer 120 does not visually shield the alignment structure 122. Therefore, the photomask PM2 may be aligned with respect to the sensor substrate 110 using the alignment structure 122 as an alignment mark.

Figure 8:
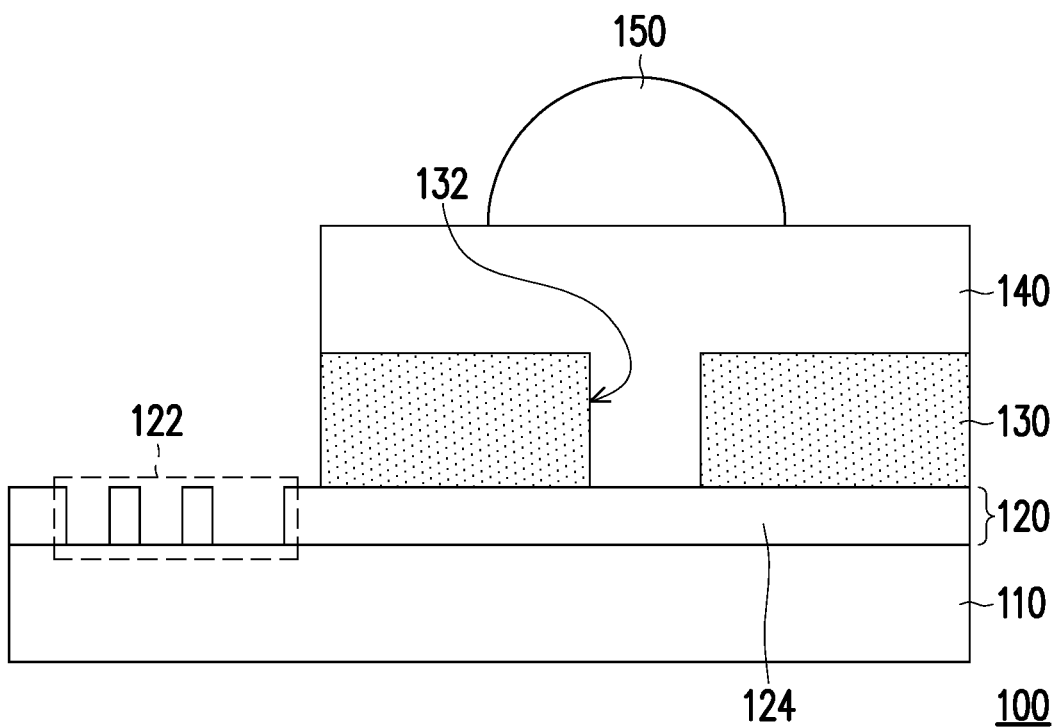

Subsequently, a developing step may be performed on the transparent material layer 140M subjected to the partial exposure step to remove unwanted portion of the transparent material layer 140M and remain the required portion of the transparent material layer 140M on the sensor substrate 110. For example, the transparent material layer 140M is patterned to form the second transparent layer 140 shown in FIG. 7. The second transparent layer 140 is disposed on the collimator layer 130 and the second transparent layer 140 may fill the aperture 132 of the collimator layer 103 and provide a flat top surface T140. Thereafter, as shown in FIG. 8, a sensor device 100 is formed by forming a lens 150 on the second transparent layer 140. The lens 150 may be positioned above the aperture 132 of the collimator layer 130. In the embodiment, the sensor device 100 may include the sensor substrate 110, the first transparent layer 120, the collimator layer 130, the second transparent layer 140 and the lens 150.

The sensor substrate 110 may include one or more sensor element therein to provide the sensing function. In some embodiments, the sensor substrate 110 may be a semiconductor substrate and the sensor element may include CMOS element, CCD element, or alternative element that have a photo-sensing function. The sensor device 100 may be used as a photo-sensor, a fingerprinting sensor or the like.

The first transparent layer 120 is disposed on the sensor substrate 110 and defines the alignment structure 122. In addition, the first transparent layer 120 may include a padding portion that is positioned above the sensor element formed in the sensor substrate 110. The first transparent layer 120 allows a radiation such as a visible light, an infrared radiation or the like to pass it through. The initial material of the first transparent layer 120 may be a photosensitive material such as a negative type photoresist material, and the first transparent layer 120 may be formed to have the required pattern by a photolithography process that may refer to the description of FIG. 2. In the case the initial material of the first transparent layer 120 is a negative type photoresist material, the first transparent layer 120 may remain on the sensor substrate 110 after photo-reaction such as photo-induced crosslinking, so that the first transparent layer 120 is dense and solid and stands on the sensor substrate 110 firmly. In other words, the first transparent layer 120 is not easily peeled off from the sensor substrate 110 to improve the reliability of the sensor device 100.

The first transparent layer 120 includes the padding portion 124 beside the alignment structure 122. The padding portion 124 may prove a flat top surface while the alignment structure 122 forms a rugged surface. In some embodiments, the alignment structure 122 may be positioned not overlapping the sensing region of the sensor element formed in the sensor substrate 110, such that the disposition of the alignment structure 122 does not limit the sensing function of the sensor device 100. As described in above, the alignment structure 122 may cause an overlying layer staggered to form an intrinsic alignment mark in the overlying layer so as to improve the fabrication yield of the sensor device 100.

The collimator layer 130 is disposed on the padding portion 124 of the first transparent layer 120 and exposes the alignment structure 122. The collimator layer 130 includes the aperture 132 positioned above the sensor element formed in the sensor substrate 110. In some embodiments, the padding portion 124 of the first transparent layer 120 may have desirable affinity to the collimator 130 and the sensor substrate 110 so that the padding portion 124 helps to prevent from the peeling of the collimator layer 130 from the sensor substrate 110.

The second transparent layer 140 is disposed on the collimator layer 130. In some embodiments, the material of the second transparent layer 140 may be the same as the material of the first transparent layer 120, but the disclosure is not limited thereto. In addition, the thickness of the second transparent layer 140 may be determined based on the optical requirement of the sensor device 100. For example, the thicker the second transparent layer 140 is the larger the focus of the sensor device 100 is, but the disclosure is not limited therein. In some embodiments, the sensor device 100 may further include one or more additional film layer disposed above and/or under the second transparent layer 140 and the focus of the sensor device 100 may be determined by all or a portion of the film layers disposed on the sensor element.

The lens 150 is disposed on the second transparent layer 140. The lens 150 is made of a material allowing a radiation such as a visible light, infrared radiation and/or the like to pass it through and has a curved top surface to provide the required optical effect. For example, the lens 150 may be a convex lens capable of converging the incident radiation, but the disclosure is not limited thereto. In some embodiments, the curvature of the curved top surface of the lens 150 may be determined based on various requirements.

Figure 9:
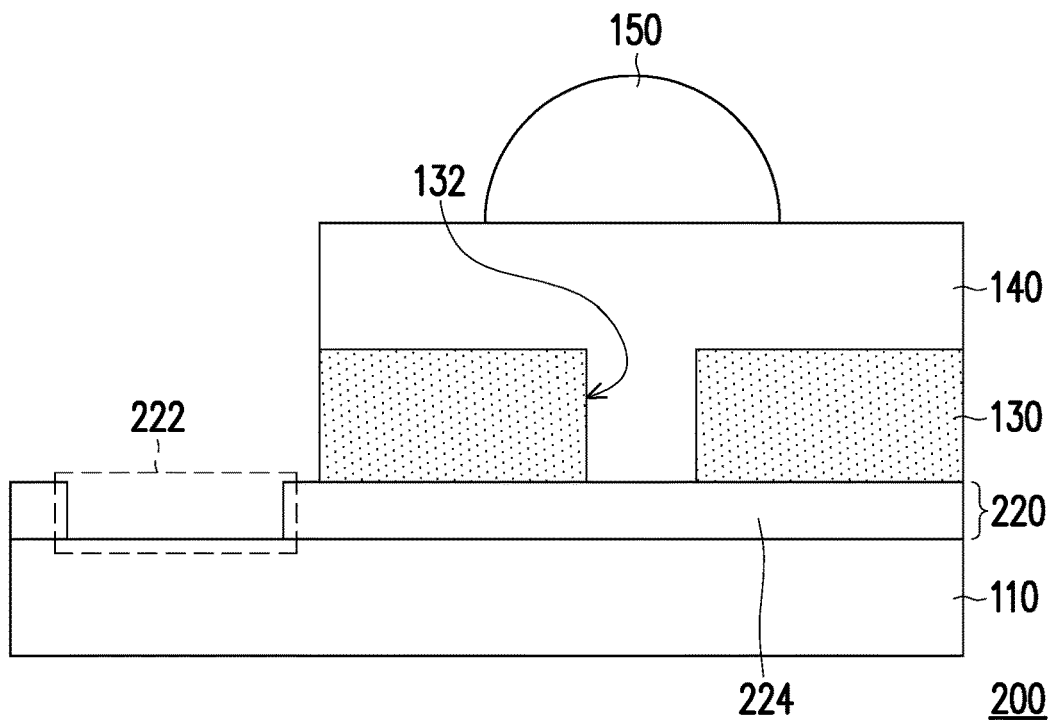
FIG. 9 schematically illustrates a sensor device in accordance with some embodiments of the disclosure.

FIG. 9 schematically illustrates a sensor device in accordance with some embodiments of the disclosure. In FIG. 9, a sensor device 200 includes a sensor substrate 110, a first transparent layer 220, a collimator layer 130, a second transparent layer 140 and a lens 150. The first transparent layer 220, the collimator layer 130, the second transparent layer 140 and the lens 150 may be sequentially disposed on the sensor substrate 110. In the embodiment, the sensor substrate 110, the collimator 130, the second transparent layer 140 and the lens 150 may be similar to those of the sensor device 100 and the details of the similar components are not reiterated here.

In the sensor device 200, the first transparent layer 220 defines an alignment structure 222 beside a padding portion 224. The collimator layer 130 is disposed above the padding portion 224 without covering the alignment structure 222, but the disclosure is not limited thereto. The material of the first transparent layer 220 may be the same as the first transparent layer 120 disclosed in the previous embodiment. Specifically, the padding portion 224 may provide a flat surface for disposing the collimator layer 130 and help to prevent from the peeling of the collimator layer 130. The alignment structure 222 is an alignment opening formed in the first transparent layer 220. In other words, the difference between the alignment structure 222 shown in FIG. 9 and the alignment structure 122 shown in FIG. 8 lies in that the alignment structure 222 shown in FIG. 9 does not include an alignment bump positioned within the alignment opening.

Figure 10:
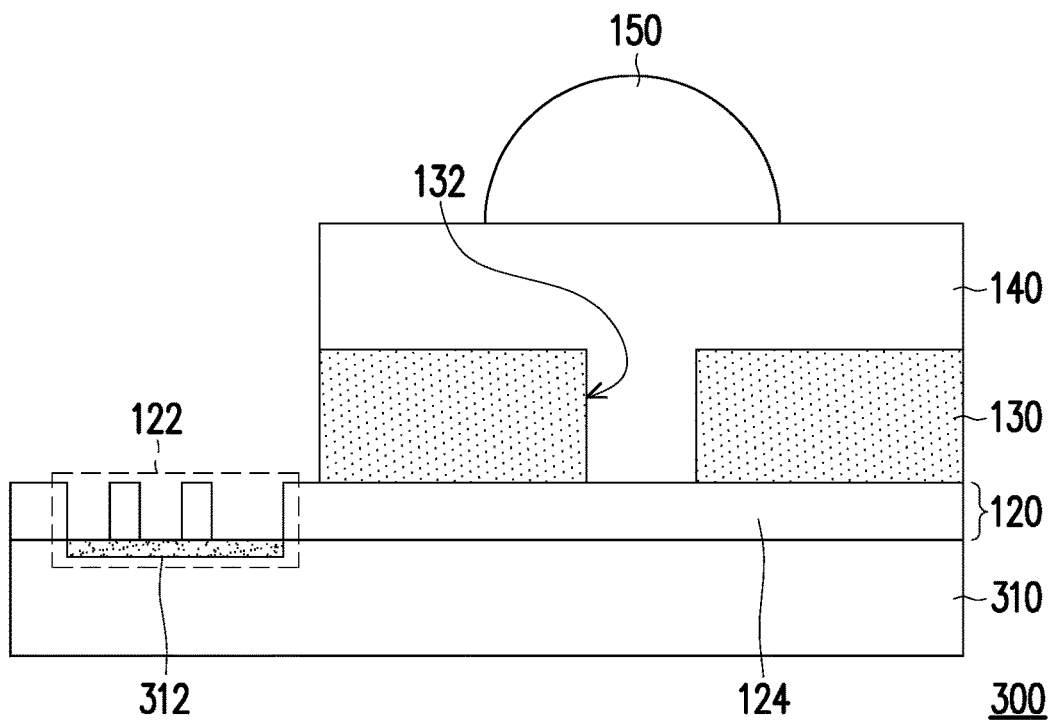
FIG. 10 schematically illustrates a sensor device in accordance with some embodiments of the disclosure.

FIG. 10 schematically illustrates a sensor device in accordance with some embodiments of the disclosure. In FIG. 10, a sensor device 300 includes a sensor substrate 310, a first transparent layer 120, a collimator layer 130, a second transparent layer 140 and a lens 150. The first transparent layer 120, the collimator layer 130, the second transparent layer 140 and the lens 150 may be sequentially disposed on the sensor substrate 310. In the embodiment, the first transparent layer 120, the collimator 130, the second transparent layer 140 and the lens 150 may be similar to those of the sensor device 100 and the details of the similar components are not reiterated here.

In the sensor device 300, the sensor substrate 310 may include an internal alignment mark 312 formed therein. Specifically, the difference between the sensor device 300 and the sensor device 100 lies in that the sensor device 300 further includes the internal alignment mark 312 in the sensor substrate 310. In some embodiments, the sensor substrate 310 having the internal alignment mark 312 may be applied to the sensor device 200. The internal alignment mark 312 may be formed by a semiconductor pattern such as a poly-silicon pattern in the sensor substrate 310. The internal alignment mark 312 may be served as the alignment reference for fabricating the sensor elements in the sensor substrate 310 and may also be served as the alignment reference for fabricating the first transparent layer 120. For example, the alignment structure 122 defined by the first transparent may be formed at a predetermined position by using the internal alignment mark 312 as an alignment reference. Therefore, the pattern of the first transparent layer 120 may be aligned with the orientation and arrangement of the sensor element formed in the sensor substrate 310.

Figure 11:
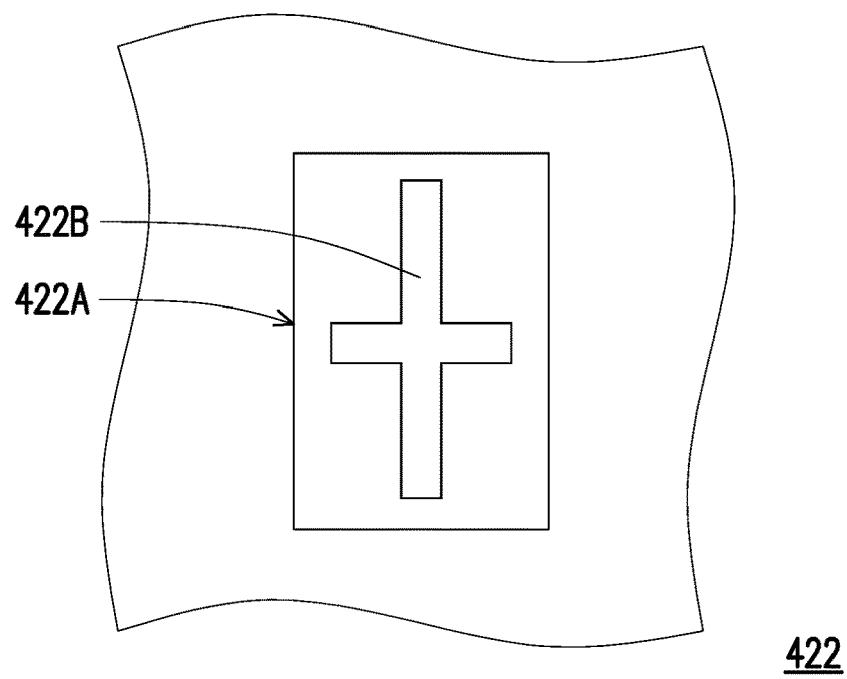
FIG. 11 and FIG. 12 each schematically illustrates a top view of the alignment structure formed in the first transparent layer in accordance with some embodiments of the disclosure.
Figure 12:
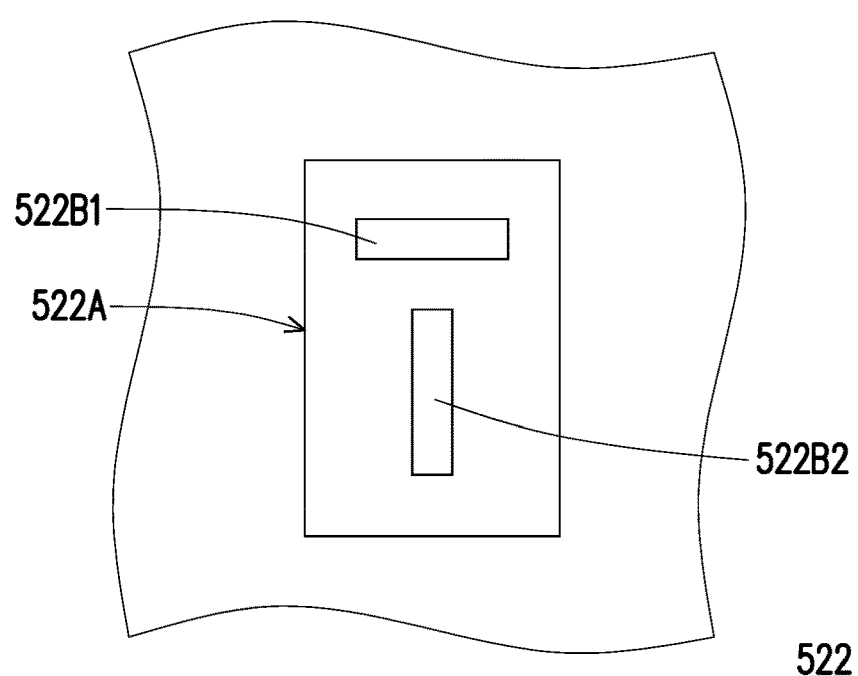

FIG. 11 and FIG. 12 each schematically illustrates a top view of the alignment structure formed in the first transparent layer in accordance with some embodiments of the disclosure. An alignment structure 422 shown in FIG. 11 may include am alignment opening 422A and an alignment bump 422B within the alignment opening 422A. The top view shape of the alignment opening 422A may be rectangular and the top view shape of the alignment bump 422B may be a cross. In addition, an alignment structure 522 shown in FIG. 12 may include am alignment opening 522A and alignment bumps 522B1 and 522B2 within the alignment opening 522A. The top view shape of the alignment opening 522A may be rectangular, the shape of the alignment bump 522B1 may be rectangular and elongate in a first direction, and the top view shape of the alignment bump 522B2 may be rectangular and elongate in a second direction intersecting with the first direction. However, the above top view shape of the alignment structure are merely examples. In some embodiments, the alignment opening may have a shape other than rectangle and the top view shape of the alignment bump may be other geometric shapes.

In view of the above, the sensor device in accordance with some embodiments of the disclosure includes an alignment structure forming a rugged surface on the sensor substrate. The alignment structure causes the overlying material layer covering the alignment structure to have an intrinsic alignment structure for alignment during the patterning process and/or an alternative process. Therefore, the material layer may be patterned to locate at a desirable position with a desirable orientation even though the material layer visually shields the underlying structures and film layers under a visual determination for alignment. The method of fabricating the sensor device may have an improved yield rate and the sensor device may have a desirable yield.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of fabricating a sensor device, comprising:
   forming a transparent material layer on a sensor substrate;
   patterning the transparent material into a first transparent layer, wherein the first transparent layer defines an alignment structure and a padding portion beside the alignment structure;
   coating a material layer on the sensor substrate, wherein a portion of the material layer covering the alignment structure is staggered along with the alignment structure; and
   patterning the material layer using the staggered portion as an alignment mark, wherein the material layer is patterned by
   aligning a photomask to the sensor substrate using the staggered portion;
   performing an exposure on the material layer through the photomask; and
   developing the material layer so that the staggered portion is removed to expose the alignment structure while another portion of the material layer on the padding portion forms a collimator layer.

2. The method of claim 1, wherein the sensor substrate comprises an internal alignment mark and the first transparent layer is formed by using the internal alignment mark for alignment.

3. The method of claims 2, wherein the material layer visually shields the internal alignment mark.

4. The method of claim 1, wherein the transparent material layer is patterned to define an alignment opening to form the alignment structure.

5. The method of claim 4, wherein the transparent material layer is patterned to define an alignment bump positioned within the alignment opening to form the alignment structure.

6. The method of claim 5, wherein the staggered portion of the material layer is staggered along with the alignment bump.

7. The method of claim 1, further forming a lens on the portion of the material layer.

* * * * *